US008605234B2

(12) United States Patent  (10) Patent No.: US 8,605,234 B2
Verschuren et al.  (45) Date of Patent: Dec. 10, 2013

(54) LIGHT GUIDE, PATTERNED LIGHT EMITTING DIODE DEVICE, ILLUMINATION SYSTEM AND METHOD OF GENERATING THE LIGHT GUIDE OR PATTERNED LIGHT EMITTING DIODE DEVICE

(75) Inventors: Coen A. Verschuren, Eindhoven (NL); Margaretha M. Kok, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 231 days.

(21) Appl. No.: 13/131,648

(22) PCT Filed: Nov. 30, 2009

(86) PCT No.: PCT/IB2009/055401
§ 371 (c)(1),
(2), (4) Date: May 27, 2011

(87) PCT Pub. No.: WO2010/064186
PCT Pub. Date: Jun. 10, 2010

(65) Prior Publication Data
US 2011/0228551 A1  Sep. 22, 2011

(30) Foreign Application Priority Data

Dec. 5, 2008  (EP) .................................. 08170773
Feb. 18, 2009  (EP) .................................. 09153063

(51) Int. Cl.
*G02F 1/1333*  (2006.01)
(52) U.S. Cl.
USPC .......................................................... 349/65
(58) Field of Classification Search
USPC .......................................................... 349/65
See application file for complete search history.

(56) References Cited

U.S. PATENT DOCUMENTS

| 7,973,880 | B2 * | 7/2011 | Sumida et al. .................. 349/65 |
| 2003/0194882 | A1 | 10/2003 | Dubowski et al. |
| 2004/0119028 | A1 | 6/2004 | McCormick et al. |
| 2004/0136173 | A1 | 7/2004 | Tsai |
| 2007/0188086 | A1 | 8/2007 | Choong |
| 2007/0290607 | A1 | 12/2007 | Okada et al. |

FOREIGN PATENT DOCUMENTS

| GB | 2400235 A | 10/2004 |
| JP | 2005310771 | 11/2005 |
| WO | 9853510 A1 | 11/1998 |
| WO | 0235245 A1 | 5/2002 |
| WO | 0248756 A1 | 6/2002 |
| WO | 2005057675 A1 | 6/2005 |
| WO | 2006129126 A2 | 12/2006 |

OTHER PUBLICATIONS

"LED-OLED Lamp Combination", www.ip.com, p. 3, May 11, 2004.

* cited by examiner

*Primary Examiner* — James Dudek
(74) *Attorney, Agent, or Firm* — Mark L. Beloborodov

(57) ABSTRACT

The invention relates to a light guide (10), a patterned light emitting diode device, to an illumination system (100) and to a method of generating a light guide and/or patterned light emitting diode device. The light guide comprising a light-emitting window (20), a rear wall (22) situated opposite said light-emitting window, edge walls (24) extending between the light-emitting window and the rear wall. The light guide further comprises a deformable substantially transparent layer (30) arranged between a light-reflective layer (40) and the rear wall of the light guide. The light-reflective layer comprises a pattern (42) constituted of local deformations (42A, 42B) of the light-reflective layer for scattering impinging light.

16 Claims, 4 Drawing Sheets

LIGHT GUIDE, PATTERNED LIGHT EMITTING DIODE DEVICE, ILLUMINATION SYSTEM AND METHOD OF GENERATING THE LIGHT GUIDE OR PATTERNED LIGHT EMITTING DIODE DEVICE

FIELD OF THE INVENTION

The invention relates to a light guide.

The invention also relates to a patterned light emitting diode device, to an illumination system and to a method of generating a light guide and/or patterned light emitting diode device.

BACKGROUND OF THE INVENTION

Light guides, also indicated as wave guides, are known per se. They are used, inter alia for spreading the light across a relatively large light emission surface and are used, for example, in backlighting units of non-emissive displays such as liquid crystal display devices, also denoted LCD panels. Such backlighting units are used, for example, in TV sets and monitors or displays of, for example, (portable) computers or (portable) telephones. Light guides may also be used for spreading light across an emission surface of a general lighting system used in general illumination applications which may be used for illuminating parts of, for example, homes, offices, public buildings, shops and even roads. Alternatively such light guides may, for example, be used for illuminating advertising boards.

The known light guides typically confine a part of the light inside the light guide for mixing the light before the mixed light is extracted from the light guide and emitted by the light guide. The extraction of the light from the light guide may be done using known extraction means, such as scratches or indentations in the light guide. The extraction of light may also be done via diffusing the light in the light guide, for example, using diffusion centers or scattering material distributed in the light guide.

Such backlighting system for illuminating an image display device is, for example, known from the patent application WO 02/35245. The backlight system from the cited patent application comprises a light-emitting panel having a front wall and, opposite thereto, a rear wall and opposite first and second light transmitting edge surfaces associated with a plurality of first and second light sources. Light originating from the light sources is diffused in the panel. Parts of the surface areas of the rear wall are provided with extraction means for extracting light from the panel. Light emitted by the light sources is partially confined in the light panel via total internal reflection and is extracted from the light panel via extraction means. The extraction means comprise wedge-shaped indentations in the panel for extracting light from the light panel. A disadvantage of the known illumination system is that the production of the extraction means is relatively complex.

SUMMARY OF THE INVENTION

It is an object of the invention to provide a light guide having extraction means for extracting light from the light guide which may be produced relatively easily.

According to a first aspect of the invention the object is achieved with a light guide as claimed in claim 1. According to a second aspect of the invention, the object is achieved with a patterned light emitting diode device as claimed in claim 7. According to a third aspect of the invention, the object is achieved with an illumination system as claimed in claim 12. According to a fourth aspect of the invention, the object is achieved with a method of generating local deformations as claimed in claim 14.

The light guide according to the first aspect of the invention comprises a light-emitting window, a rear wall situated opposite said light-emitting window, edge walls extending between the light-emitting window and the rear wall, the light guide further comprising a deformable substantially transparent layer arranged between a light-reflective layer and the rear wall of the light guide, the light-reflective layer comprising a pattern constituted of local deformations of the light-reflective layer for scattering impinging light.

An effect of the presence of the deformable substantially transparent layer between the light-reflective layer and the rear wall of the light guide is that the light-reflective layer may be deformed via the simultaneous deformation of the deformable substantially transparent layer and the light-reflective layer and as such generate a non-even reflective surface at a side of the light reflective layer facing the light guide. In the light guide according to the invention, the light guide comprises a deformable substantially transparent layer arranged between the light-reflective layer and the light guide. This deformable transparent layer may be used to generate local deformations in the light-reflective layer such that these deformations cause the local scattering of the impinging light such that a part of the scattered light is coupled out from the light guide. The local deformations may be generated by applying locally increased temperature, for example, by "writing" the local deformations using a laser. Alternatively, for example, stamping techniques may be used to generate the deformations. The deformable substantially transparent layer is essential as the light guide material typically is of glass or quartz to ensure light conduction without excessive loss of light due to absorption. This light guide material typically does not deform easily. By applying the deformable substantially transparent layer, the local deformations may be generated in the deformable transparent layer causing the light-reflective layer to be deformed as well. As such, it is relatively easy to adapt the local deformations to, for example, match the specific requirements of an image projection system.

The arrangement of local deformations enhances the scattering of the light impinging on the deformations of the light-reflecting layer and as such enhances the out-coupling of light from the light guide. Typically, light is at least partially confined in a light guide as light impinging on the interface between the light guide and its surroundings at a relatively large angle of incidence with respect to a normal axis of the reflection interface are reflected back into the light guide due to total internal reflection. This at least partial confinement may be done on purpose to evenly spread the light throughout the light guide, especially when the light is introduced into the light guide via an edge wall of the light guide the at least partial confinement may spread the light evenly through the light guide. Still, the confinement also reduces the emission efficiency, especially when part of the light guide may absorb part of the distributed light. The extraction of the light from the light guide typically is an issue. The extraction of the light from the light guide should preferably result in a uniform emission of the light across the light-emitting window while the light guide may require sufficient confinement to evenly spread the light throughout the light guide. In the known light guides, the extraction of the light is done via indentation or scratches at the rear wall or at the light-emitting window of the light guide. Alternatively, scattering elements are evenly distributed inside the light guide which may, for example, be constituted of mouldable material in which scattering elements may be distributed. In all of these solutions for extracting light from the light guide, the indentations, structures or scattering elements have a predefined distribution to obtain a specific light extraction effect. The indentations and scratches must be produced via etching or mechanical deformation which may damage the light guide or which are relatively expensive and time-consuming processes. To implement, for example, scattering elements evenly within the light guide, the light guide must be manufactured of mouldable and/or liquidisable material, such as PMMA. In the mouldable or liquid phase, the scattering material may be mixed and distributed and after the light guide hardens, the predefined distribution of the scattering material is generated. Again, a relatively time-consuming process and a process which cannot be altered after the predefined distribution is created. In the light guide according to the invention, the rear wall of the light guide comprises at least two layers, one of which is a deformable substantially transparent layer and the at least second layer is the light-reflective layer. By deforming the deformable substantially transparent layer, the light-reflective layer may also be deformed, especially at a side of the reflective layer facing the light guide. This local deforming of the deformable substantially transparent layer together with the light-reflective layer may be done using local pressure or by locally applying heat, for example, via laser irradiation. Due to this arrangement, a pattern of deformations may be generated relatively easily which may even be adapted at a later stage to correct for errors or to apply changes in the light extraction distribution. Applying the reflective layer directly on the rear wall of the light guide would not provide a sufficient solution, as such a configuration would still require the rear wall light guide itself to be altered to generate the deformations, which generally is not preferred and which typically require etching steps which are time consuming and expensive.

A further benefit of the light guide according to the invention is that the production of the light guide may be relatively standardised in that both the deformable substantially transparent layer and the light-reflective layer may be applied as smooth flat layer, for example, via well known and well controlled spin-coating processes. After such relatively smooth layers have been applied, the required pattern of deformations to have good light extraction may be applied via a process similar to laser printing. As such, different patterns of deformations may be applied relatively easily. Furthermore, errors in the deformation may be corrected layer by adapting further deformations.

An even further benefit of the light guide according to the invention is that the pattern of deformations for extracting light may be used to compensate any variations in the light emitted by the light sources. When, for example, an illumination system comprises a plurality of light sources and the light guide according to the invention, intensity variations of the light sources may be visible at the light-emitting window as uniformity variations because the light is not sufficiently mixed inside the light guide. In such an arrangement, the distribution of the deformations may be adapted to correct for any intensity variations of the light sources. For example, in backlight systems for TV-applications and/or monitor applications, a plurality of light emitting diodes are used to provide sufficient light intensity which often is distributed across the monitor via a light guide. To ensure a relatively uniform light distribution across the light-emitting window, the light sources are binned. During the binning process the emission characteristics of the light sources are measured and compared with each other. Light sources having similar emission characteristics are collected and the backlight system of a single TV application or monitor application comprises only light sources having similar emission characteristics, or said differently, having been binned. By using the light guide according to the invention, the binning of light sources is no longer required. After having applied the light sources in the application, the emission uniformity may be measured and from these measurements a distribution of deformations may be determined which corrects for any uniformity variations which may be caused by emission variations of the light sources. This specifically determined distribution of deformations may, subsequently be applied to the light guide to generate a substantially uniform light emission distribution. As the applying of the pattern may be done relatively easily and cost-effectively via, for example, laser printing processes, the use of the light guide according to the invention generates a uniformly illuminated monitor without having to bin the light sources.

Finally, in the light guide according to the invention the distribution of the deformations may be changed or adapted at a later stage in the production process. For example, an initial distribution of deformations may be generated which may be used to measure the uniformity of the light emitted by the light guide. If the uniformity is not good enough, the pattern may be adapted to further improve the uniformity. For example, low-end monitors comprise a predefined distribution of deformations, and high-end monitors further comprise a measurement procedure for more accurately measure the light distribution and, for example, in a later stage comprise additional deformations applied in a second laser printing process to further improve the uniformity or adapt the distribution to correct any remaining non-uniformities. As such, using the light guide according to the invention enables a later optimization of the uniformity and thus provides improved production flexibility for designers.

Preferably, the deformable substantially transparent layer is directly applied to the rear wall of the light guide, and the light-reflective layer is directly applied to the deformable substantially transparent layer. A benefit of such arrangement is that the reflective part of the light-reflective layer is embedded and thus not exposed to the environment. Because light-reflective layers typically comprise a metal layer which is prone to oxidation, the applying of the deformable substantially transparent layer arranged between the light guide and the light-reflective layer prevents oxygen and moisture to reach the reflective part of the light-reflective layer and thus ensuring high reflectivity over a long period of time.

In an embodiment of the light guide, the light-reflective layer and/or the deformable substantially transparent layer is configured for being locally deformed when irradiated with electro-magnetic radiation having a power below an ablation threshold of any of the layers of the light guide. Electro-magnetic radiation, especially laser radiation may be used to locally generate relatively high temperatures for a short time, enabling the local deformation of the light-reflective layer and/or the deformable substantially transparent layer. However, when the deformation is too strong or the local temperature too high, the light-reflective layer may break causing light to leak away from the light-emitting window which typically is lost. Furthermore, damaging the deformable substantially transparent layer may cause compartments comprising fluids having a different refractive index compared to the refractive index of the deformable substantially transparent layer which enhances the confinement of the light inside the light guide, rather than the extraction of the light from the light guide to the light-reflective layer. Local heating of the layers applied to the light guide to generate local deformations without damaging the layers is called buckling. By, for example, carefully choosing the wavelength and/or intensity of the impinging laser light buckling can be achieved without ablation of parts of the applied layers on the light guide. The deformable substantially transparent layer may be substantially transparent for the light which is guided by the light guide, but may not be transparent to the light used to locally deform the deformable layer together with the light-reflective layer.

Alternatively, deformations may be generated using a stamping process for pressing the deformations into the layers applied to the rear wall of the light guide. The overall temperature of the light guide including the applied layers may be raised such that the deformable substantially transparent layer may be deformed easily.

In an embodiment of the light guide, the pattern is configured for generating a predefined distribution of light emitted across the light-emitting window. The pattern may, for example, be a substantially continuous pattern distributed across a reflective area of the light-reflective layer to reflect light away from the reflective layer to generate a substantially uniformly illumination of the light-emitting window with reflected light and directly impinging light. Alternatively, the pattern of deformations may comprise a predefined structure, for example, representing text or an image which may be viewed through the light-emitting window. The densities of deformations may be configured to compensate for non-uniformities of the light emitters which emit light, for example, from the edge-wall into the light guide.

In an embodiment of the light guide, the refractive index of the deformable substantially transparent layer is equal to or higher compared to the refractive index of the light guide. A benefit of this embodiment is that the relatively high refractive index of the deformable substantially transparent layer reduces the confinement of light inside the light guide via total internal reflection. The light is extracted from the light guide due to the difference in refractive index, after which the extracted light impinges on the light-reflective layer. When the light-reflective layer is deformed at the location where the light impinges on the light-reflective layer, the impinging light is scattered in different directions, thus enabling much of the light to be coupled out from the light guide. Preferably the light-emitting window forms a border between the light guide and a substance having reduced refractive index compared to the refractive index of the light guide, for example, to air. Due to the presence of the substance having reduced refractive index at the light-emitting window, the confinement of the light is enhanced due to the refractive index variation. As a consequence, the light only transmits through the light-emitting window when having a relatively small angle with a normal axis of the light-emitting window, while the remainder of the light is confined inside the light guide and is subsequently extracted from the light guide towards the light-reflective layer via the deformable substantially transparent layer. The deformations may then alter the direction of the reflected light such that a major part of the reflected light will transmit the light-emitting window and thus be emitted from the light guide. The shape of the deformations and the density of the deformations determine the extraction of the light from the light guide and a distribution of the deformation and a variation in the density of the deformations may be used to generate a specific distribution of the light emitted via the light-emitting window, for example, a substantially uniform distribution.

In an embodiment of the light guide, the pattern comprises a plurality of grey-levels, the different grey-levels comprising a different density of the deformations of the light-reflective layer, and/or comprising a different height of the deformations of the light-reflective layer, the height being a dimension substantially perpendicular to the light-reflective layer. Substantially perpendicular to the light-reflective layer is used to express that the height is substantially perpendicular to the arrangement of the whole layer and not to the local deformation of the layer. Using such grey-levels enables to write specific patterns such as text or images on the light guide which may be visible through the light-emitting window. The grey levels as defined may also be used to alter the local light extraction intensity to generate a uniform light emission via the light-emitting window.

In an embodiment of the light guide, a wavelength of the electro-magnetic radiation for generating the deformations is in a range between 320 nanometers and 2000 nanometers. Generally using a wavelength in which laser light sources are commonly available enables relatively simple and cheap systems for generating the pattern into the light-reflective of the light emitting diode device. Such wavelength may, for example, be 405 nanometers emitting laser diode or a 532 nanometers emitting YAG laser. Laser systems operating in the infrared part of the spectrum can be used as well, since the patterning relies on a localized heating of the light-reflective layer.

The patterned light emitting diode device according to the second aspect of the invention comprises the light guide according to any of the claims 1 to 6, wherein the patterned light emitting diode device comprises a layer of light emitting material and comprising the light-reflective layer being visible through a light-emitting window of the light guide of the patterned light emitting diode device, the light-reflective layer comprising a pattern constituted of local deformations of the light-reflective layer.

The patterned light emitting diode device according to the invention may, for example, be produced on the light guide being a glass substrate on which the processing of the layers are arranged which constitute the patterned light emitting diode device. Typically the confinement of the light inside the glass substrate acting as the light guide limits the efficiency of the known light emitting diode devices. Especially when the light emitting diode device is an organic light emitting diode device generated on a relatively large substrate, the confinement of the generated light inside the substrate which acts as the light guide is significant. Light which is captured in the substrate is partially absorbed in the substrate and will also circulate through the light generating layer of the organic light emitting diode device where a re-absorption of the generated light may occur. As such, the confinement of the light generated by the light emitting diode device in the substrate which acts as a light guide is not preferred and the confinement of the light generated by the light emitting diode device in the substrate limits the efficiency of light emitting diode devices. By adapting the light-reflective layer to comprise deformations, scattering of the light is enhanced thus improving the out-coupling of light from the light emitting diode device and as such significantly improving the efficiency of the light emitted by the light emitting diode device.

One of the electrode layers may constitute the light-reflective layer while the organic light emitting layer may constitute the deformable substantially transparent layer. Together the layer arrangement may enable local deformations enhancing the extraction of light from the light emitting diode device.

Applying a continuous pattern of deformations parallel to the substrate of the organic light emitting diode device, improves the extraction of light from the substrate which acts as a light guide and as such improves the efficiency of the organic light emitting diode device. Such substantially continuous pattern may comprise a predefined variation of the deformations and as such comprise a predefined distribution of extraction structures which may be used to define a specific uniformity distribution of the light emitted across the out-couple window or which may be used to correct local intensity variations to generate a uniform light distribution across the out-couple window.

Alternatively, the pattern may generate a visible image or text. In such an embodiment the pattern constituted of deformations is permanently visible during both an off-state of the patterned light emitting diode device and during an on-state of the patterned light emitting diode device. During the off-state the patterned light emitting diode device does not emit light and the pattern is visible on the patterned light emitting diode device due to the difference in scattering of external light from the deformations, providing an attractive scattering metallic appearance. During the on-state the patterned light emitting diode device emits light and the pattern remains visible due to the different scattering of light generated by the patterned light emitting diode device as well as external light impinging at the location of the pattern due to the deformations.

The light emitting diode device according to the invention may both be, for example, either a polymer organic light emitting diode device or a small molecule organic light emitting diode device. As the pattern is not generated in the light emitting material but rather in the light-reflective layer, the pattern may be generated with substantially the same effort in both the polymer organic light emitting diode device devices and the small molecule organic light emitting diode device devices. As such, by applying the pattern in the light-reflective layer rather than in the light emitting material, the pattern may be applied in either of the polymer organic light emitting diode device devices and the small molecule organic light emitting diode device devices via substantially the same methods and/or tools.

In an embodiment of the patterned light emitting diode device, the deformable substantially transparent layer comprises light emitting material of the light emitting diode device arranged between an anode layer and a cathode layer, the anode layer or cathode layer being the light-reflective layer comprising the pattern constituted of deformations while substantially maintaining a conductivity of the light-reflective layer parallel to the light-reflective layer.

Substantially maintaining the conductivity of the light-reflective layer indicates that the overall conductivity across the light-reflective layer is maintained while, for example, minute holes and/or cracks may appear. Although in a preferred embodiment of the patterned light emitting diode device, no holes and/or cracks are present in the light-reflective layer as they would poorly reflect the light, the patterned light emitting diode device still operates with these minute holes and/or cracks present. The quality of the pattern may be reduced due to these minute holes and/or cracks reducing the attractive metallic appearance of the pattern and reducing the increase of efficiency due to the presence of the deformations. Minute holes and/or cracks preferably have dimensions which are not visible by the naked human eye and/or may have dimensions, for example, smaller than 100 μm, and more preferably smaller than 10 μm.

The light emitting material may, for example, be organic light emitting material. Such organic light emitting diode device is an area light source in contrast to standard light emitting diodes. Such area light sources are becoming more popular in, for example, decorative applications. Visually appealing patterning offers further customization/personalization of such area light source. The organic layer enables the presence of the deformations as the organic layer constitutes a plastically deformable ('compliant') layer.

Preferably the deformations in the light-reflective layer being the anode-layer or cathode-layer is done without damaging any of the remaining layers constituting the light emitting diode device, for example, layers which are used for the light emission. As the deformations are generated in the anode-layer or cathode-layer such that substantially the conductivity of the light-reflective layer is maintained, the whole light emitting surface of the light emitting diode device will radiate light while the pattern remains visible.

In an embodiment of the patterned light emitting diode device, the patterned light emitting diode device comprises the anode layer and the cathode layer, and wherein at least a part of the anode layer or the cathode layer is configured to be substantially transparent to the electro-magnetic radiation. Such an embodiment enables that the patterning may be performed after the light emitting diode device has been produced in, for example, a substantially standard production process. The stack of layers constituting the patterned light emitting diode device comprises an organic light emitting material embedded between the anode layer and cathode layer. This stack of layers is arranged on the substrate. If, for example, the cathode layer is the light reflecting layer, part of the anode layer is preferably substantially transparent to the electro-magnetic radiation used for generating the pattern of deformations. If, for example, the anode is the light reflecting layer, part of the cathode is preferably substantially transparent to the electro-magnetic radiation used for generating the pattern. In such an arrangement, the pattern may be applied after the anode and/or cathode layer have been applied on the light emitting diode device to generate the patterned light emitting diode device.

In an embodiment of the patterned light emitting diode device, the deformations have been generated while substantially preventing damaging a contact between subsequent layers of the patterned light emitting diode device. Damaging a contact between subsequent layers of the patterned light emitting diode device is also known as delaminating of a stack of layers. This delaminating may prevent current to flow through the stack of layers which constitutes the light emitting diode device and as such prevent light from being generated at the delaminated regions. As such, this delaminating over a relatively large area should be avoided.

Substantially preventing damaging a contact between subsequent layers indicates that the overall conductivity through the layers is maintained. Although not preferred, still minute holes and/or cracks may appear. This minute holes and/or cracks reduce the area of the light emitting diode device over which light is emitted from the patterned light emitting diode device, and as such the quality of the light emitting device may be reduced. Still, although the local deformations may lead to these minute holes and/or cracks which may reduce the area over which light is emitted by the light emitting diode device, the efficiency due to the presence of the deformations and the improved extraction of the light from the substrate which acts as light guide still improves the overall efficiency of the patterned light emitting diode device. Minute holes and/or cracks preferably have dimensions which are not visible by the naked human eye and/or may have dimensions, for example, smaller than 100 μm, and more preferably smaller than 10 μm.

In an embodiment of the patterned light emitting diode device, the area of the patterned light emitting diode device comprising the deformations is equal or smaller compared to the area of the patterned light emitting diode device being free from deformations. Although the contact between the subsequent layers of the patterned light emitting diode device should be maintained to ensure that the light emitting diode device can emit light, at the location of the deformations, this may not be the case. By limiting the extent over which the deformations are distributed across the light-reflecting layer, the area from which reduced light or no light is emitted is limited while still the efficiency of the extraction of the light is increased substantially. In such an arrangement, for example, delaminating may occur at for example ten percent of the surface of the light-reflective layer and thus this ten percent of the surface of the patterned light emitting diode device will not emit light. When, however, the extraction of light emitted by the remainder of the surface is increased by, for example, thirty percent, still an overall increase of the light efficiency is achieved.

Especially when generating the deformations through the substrate acting as a light guide and through the stack of layers constituting the light emitting diode device, some of the layers constituting the light emitting diode device may be damaged due to the relatively high laser power, causing the light emitting diode device to locally not emit light. The increase of extraction of the confined light preferably more than compensates for the reduced light generation in the light emitting diode device.

The illumination system according to the third aspect of the invention comprises the light guide according to claims 1 to 6 and a light source configured for coupling at least a part of the light generated by the light source into the light guide, or comprising a patterned light emitting diode device according to claims 7 to 9 and the light source configured for coupling at least a part of the light generated by the light source into the light guide of the patterned light emitting diode device. The distribution of the deformations in the light guide determines the distribution of the light from the light source coupled into the light guide and subsequently emitted by the light guide. Alternatively, the distribution of the deformations in the patterned light emitting diode device increases the efficiency of the patterned light emitting diode device and determines the distribution of the light from the light source coupled into the light guide and emitted by the light guide. This combination of patterned light emitting diode device arranged on the substrate with an additional light source which is configured for coupling at least a part of the light from the light source into the substrate enables to adapt, for example a color of the light emitted by the illumination system. Typically for organic light emitting diode devices, the change of color is not easily done and typically requires a plurality of different organic layers and different anode and cathode layers to be applied such that the color of the light emitted by the organic light emitting diode device can be altered. In the illumination system according to the invention, an additional light source is arranged to couple light into the substrate of a patterned light emitting diode device, for example, being an organic light emitting diode device. Light of the additional light source may be added to the light emitted by the patterned light emitting diode device by simply increasing the intensity of the light source. Using the deformations both for the light emitted by the patterned light emitting diode device and for the light emitted by the light source causes the light to be mixed inside the substrate acting as a light guide and enables the illumination system to relatively easily alter the color of the light emitted from the illumination system.

In an embodiment of the illumination system, the light source is configured for emitting light into the light guide in a direction substantially parallel to the light-emitting window for at least partially confining the light emitted by the light source in the light guide via total internal reflection at the light-emitting window. The light source is configured, for example, as an edge-illuminator illuminating at least part of the light into an edge wall into the light guide. Alternatively, the light source is a side-emitter embedded in the light guide and emitting light substantially parallel to the light-emitting window. With the wording substantially parallel to the light-emitting window is meant that a central axis or plane of the emission of light is arranged substantially parallel to the light-emitting window.

The method of generating local deformations according to the fourth aspect of the invention in a light guide according to claims 1 to 6 or for generating local deformations in a patterned light emitting diode device according to claims 7 to 11, the method of generating comprises the step of:
locally deforming the light-reflective layer and/or the deformable substantially transparent layer for generating the deformations constituting the pattern.

In an embodiment of the method, the step of locally deforming comprises:
an illumination step for illuminating part of the light-reflective layer and/or the deformable substantially transparent layer with electro-magnetic radiation for generating the pattern, the electro-magnetic radiation locally altering a temperature of the light-reflective layer and/or the deformable substantially transparent layer for deforming the light-reflective layer and/or the deformable substantially transparent layer while having a power below an ablation threshold of any of the layers of the light guide.

The use of the illumination step enables a relatively simple and cost-effective manner to generate the pattern of deformations such that the extraction distribution across the light guide can be determined and possibly later even corrected by adapting the pattern of deformations. In the illumination step, preferably a condensed light beam is used. The illumination step may be performed through the light-emitting window or may be applied directly to the light-reflective layer by illuminating the rear wall of the light guide or patterned light emitting diode device. When illuminating through the patterned light emitting diode device the illumination may damage the patterned light emitting diode device, for example, damage any of the current transport layers which may cause the patterned light emitting diode device to locally cease light emission. Alternatively, the local deformations preferably should be limited to not cause delaminating of the layers of the light guide and/or the patterned light emitting diode device. Delaminating in the light guide and/or the patterned light emitting diode device would cause the extraction of light from the light guide to the reflective layer to be reduced or to cease and as such would cause increased confinement of the light in the light guide. Delaminating in the patterned light emitting diode device would further reduce the current flowing through the patterned light emitting diode device and as such would reduce the area over which light is generated by the patterned light emitting diode device.

The method may further comprise a step of varying a density of the local deformations for generating a plurality of grey-levels and/or comprising a step of varying a height of the deformations for generating a plurality of grey-levels. The different grey-levels each comprise different levels of density of the deformations and/or different height of the deformations on the light-reflective layer. The height is defined as a dimension substantially perpendicular to the light-reflective layer.

In an embodiment of the method, the method further comprises the step of: measuring an emission characteristic of the light guide, determining from the measured emission characteristic a pattern of deformations for generating a predefined light distribution across the light-emitting window, and generating the deformations according to the determined pattern for generating the predefined light distribution.

In this embodiment of the method of generating the local deformations, the method first measures the emission distribution of the light guide and subsequently determines which distribution is required to generate the predefined light distribution. This predefined light distribution may, for example, be a uniform distribution, but may also be any other light distribution required. Because the deformations may be generated relatively easily, for example, via laser irradiation, and because the deformations may be applied at substantially any time in the production process, the uniformity may be measured and may be corrected by adapting the distribution of the deformations.

In an alternative embodiment of the method of generating the deformations in a patterned light emitting diode device, the step of locally deforming the light-reflective layer and/or the deformable substantially transparent layer is performed during a production process of the light emitting diode device. A benefit of this embodiment is that substantially no other material layers may be present when patterning the light-reflective layer and/or the deformable substantially transparent layer which other material layer may also have been influenced by, for example, impinging light. Furthermore, the production process of the light emitting diode devices is typically a well controlled production process. Performing the patterning step during the production process generally enables the production process to be adapted such that the life-time of the device is only marginally influenced or not influenced at all due to the patterning.

A drawback is that the production of light emitting diode device is typically on a relatively large scale. Often the patterning of the light emitting diode devices is required on smaller scales compared to the typical production scale of light emitting diode devices. As such, a production of a specific pattern in the light emitting diode device outside the production process may be preferred.

In an embodiment of the method of generating, the method may adapt a focusing means for controlling a focus location and/or spot-size of the condensed light beam for generating the local deformations. Alternatively, an energy level, color and/or scanning speed of the condensed light beam may be controlled for generating the local deformations. As indicated before, the inventors have found that the density and/or height of the deformations may be altered to different extents for generating grey-levels. However, to ensure that the power of the deposited light per illuminated area per time does not exceed a predefined power-level, the system may control the energy level, color and/or scanning speed of the condensed light beam.

BRIEF DESCRIPTION OF THE DRAWINGS

These and other aspects of the invention are apparent from and will be elucidated with reference to the embodiments described hereinafter.

In the drawings.

DETAILED DESCRIPTION OF EMBODIMENTS

Figure 1A:
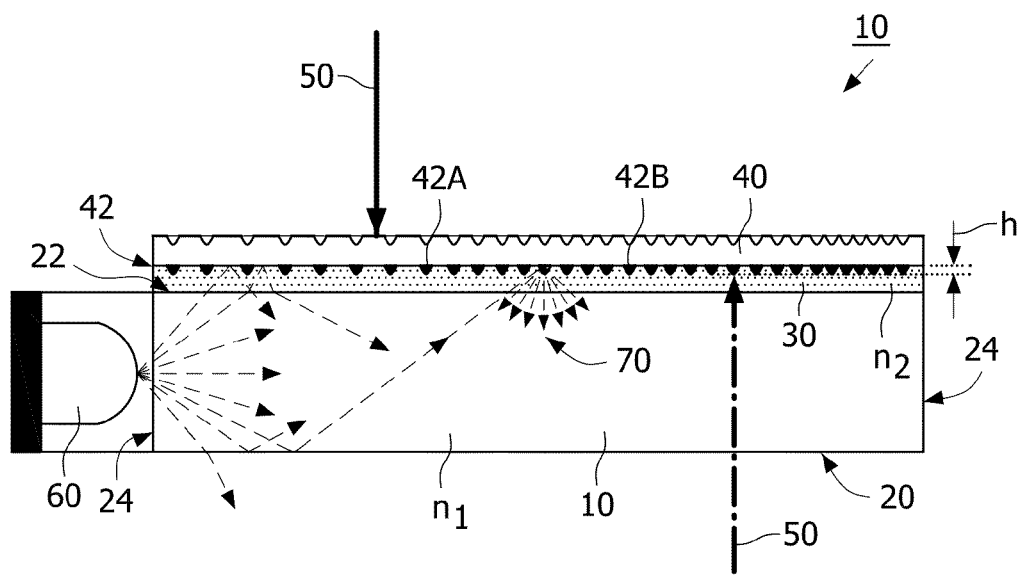
FIGS. 1A and 1B shows a schematic cross-sectional view of a light guide according to the invention.
Figure 1B:
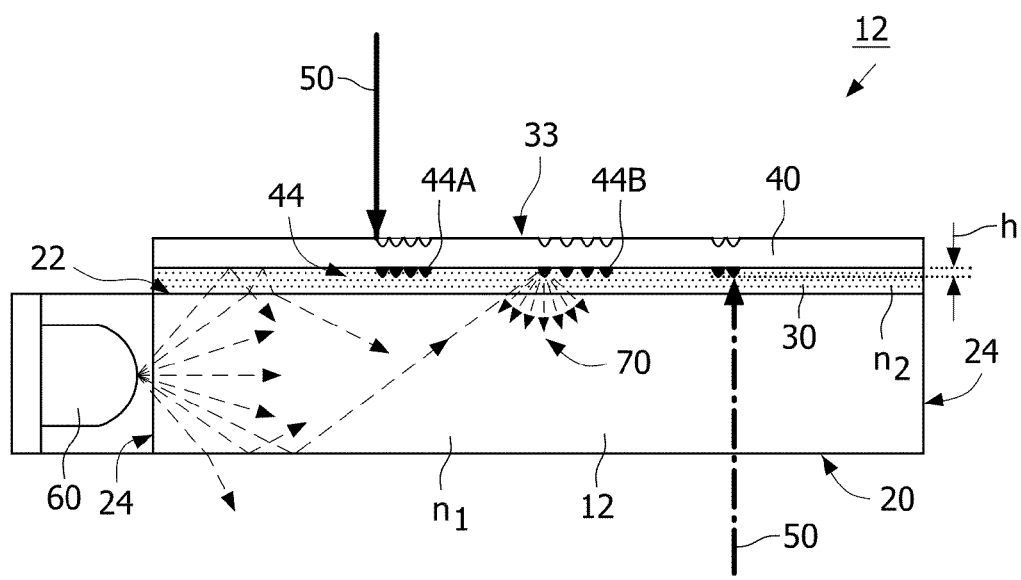

FIGS. 1A and 1B show a schematic cross-sectional view of a light guide 10, 12 according to the invention. The light guide 10, 12 comprises a light-emitting window 20, a rear wall 22 situated opposite said light-emitting window 20 and edge walls 24 extending between the light-emitting window 20 and the rear wall 22. The light guide 10, 12 further comprises a plurality of layers 30, 32, 40 comprising a deformable substantially transparent layer 30, and a light-reflective layer 40. The light guide 10, 12 as shown in FIGS. 1A and 1B comprises a pattern 42, 44 constituted of deformations 42A, 42B, 44A, 44B in the light-reflective layer 40. A light guide 10, 12 is typically used for distributing and/or mixing light throughout the light guide 10, 12. In the embodiments shown in FIGS. 1A and 1B a light source 60 is arranged at an edge wall 24 of the light guide 10, 12 to emit light (indicated with dashed arrows) into the light guide 10, 12 which is subsequently at least partially confined inside the light guide 10, 12 typically via total internal reflection. This confinement enables that the light inside the light guide 10, 12 is distributed across the light guide 10, 12 and is mixed to, for example, evenly spread the light in the light guide 10, 12. To extract the light which is confined inside the light guide 10, 12 from the light guide 10, 12 often light extraction structures are present in known light guides, for example, at the rear wall 22 of the known light guide. These extraction structures are often constituted of scratches or indentations into the light guide 10, 12 or constituted of scattering material embedded in (a part of) the light guide 10, 12 to redirect the confined light and as such couple a part of the redirected light out of the light guide 10, 12.

The light guide 10, 12 according to the invention comprises the deformable substantially transparent layer 30 arranged between the light-reflective layer 40 and the rear wall 22 of the light guide 10, 12. This arrangement of the deformable substantially transparent layer 30 between the light-reflective layer 40 and the rear wall 22 allows deformations 42A, 42B, 44A, 44B to be generated at a side of the light-reflective layer 40 facing the light guide 10, 12. Via simultaneous deformation of the deformable substantially transparent layer 30 and the light-reflective layer 40 a non-even reflective surface 40 is generated at a side of the light reflective layer facing the light guide 10, 12. These deformations 42A, 42B, 44A, 44B in the light-reflective layer 40 cause the local scattering 70 of the impinging light such that a part of the scattered light 70 is coupled out from the light guide 10, 12. The local deformations 42A, 42B, 44A, 44B may be generated by applying locally increased temperature, for example, by "writing" the local deformations 42A, 42B, 44A, 44B using a laser beam 50. Alternatively, for example, stamping techniques (not shown) may be used to generate the deformations 42A, 42B, 44A, 44B. The deformable substantially transparent layer 30 is essential as the light guide material typically is of glass or quartz to ensure light conduction without excessive loss of light due to absorption. This light guide material typically does not deform easily. In the known light guides, the scratches or indentations often are etched into the known light guide which is a relatively expensive and time consuming procedure. In the light guide 10, 12 according to the invention the deformable substantially transparent layer 30 is present allowing local deformations 42A, 42B, 44A, 44B to be generated in the light-reflective layer 40 at a side facing the light guide 10, 12. These deformations 42A, 42B, 44A, 44B scatter impinging light and thus couple out part of the impinging light. Furthermore, the deformations 42A, 42B, 44A, 44B are relatively easy to apply and to adapt to obtain a specific emission distribution from the light guide 10, 12.

The production of the light guide 10, 12 before the deformations 42A, 42B, 44A, 44B are applied may be relatively standardised in that both the deformable substantially transparent layer 30 and the light-reflective layer 40 may be applied as smooth flat layer, for example, via well known and well controlled spin-coating processes. After such relatively smooth layers have been applied, the required pattern 42, 44 of deformations 42A, 42B, 44A, 44B may be applied via a process similar to laser printing. As such, different patterns 42, 44 of deformations 42A, 42B, 44A, 44B may be applied relatively easily. Furthermore, errors in the pattern 42, 44 of deformations 42A, 42B, 44A, 44B may be corrected to some extent, for example, by adding further deformations 42A, 42B, 44A, 44B.

The pattern 42, 44 of deformations 42A, 42B, 44A, 44B may be optimised to compensate for variations in the intensity of light emitted by the light sources 60. When, for example, an illumination system comprises a plurality of light sources 60 (not shown) emitting part of the light into the light guide 10,12 according to the invention, intensity variations of the light sources 60 may be visible as uniformity variations at the light-emitting window 20 of the light guide 10, 12. In such an arrangement, the distribution of the deformations 42A, 42B, 44A, 44B may be adapted to correct for any intensity variations of the light sources 60. For example, the emission uniformity of the light guide 10, 12 may be measured and from these measurements a distribution of deformations 42A, 42B, 44A, 44B may be determined which corrects for any uniformity variations which may be present and which may, for example, be caused by emission variations of the light sources 60. This specifically determined distribution of deformations 42A, 42B, 44A, 44B may, subsequently be applied to the light guide 10, 12 to generate a substantially uniform light emission distribution. As the applying of the pattern 42, 44 may be done relatively easily and cost-effectively via, for example, laser printing processes, the use of the light guide 10, 12 according to the invention may prevent binning light sources 60 to match intensity variations between light sources 60 and may further optimise the uniformity of the light emitted from the light guide 10, 12.

Preferably, the deformable substantially transparent layer 30 is directly applied to the rear wall 22 of the light guide 10, 12, and the light-reflective layer 40 is directly applied to the deformable substantially transparent layer 30. In such arrangement the reflective part of the light-reflective layer 40 is embedded in the deformable substantially transparent layer 22 and thus not exposed to the environment which prevents oxygen and moisture to reach the reflective part of the light-reflective layer 40 and thus preserve high reflectivity over a long period of time.

Figure 3A:
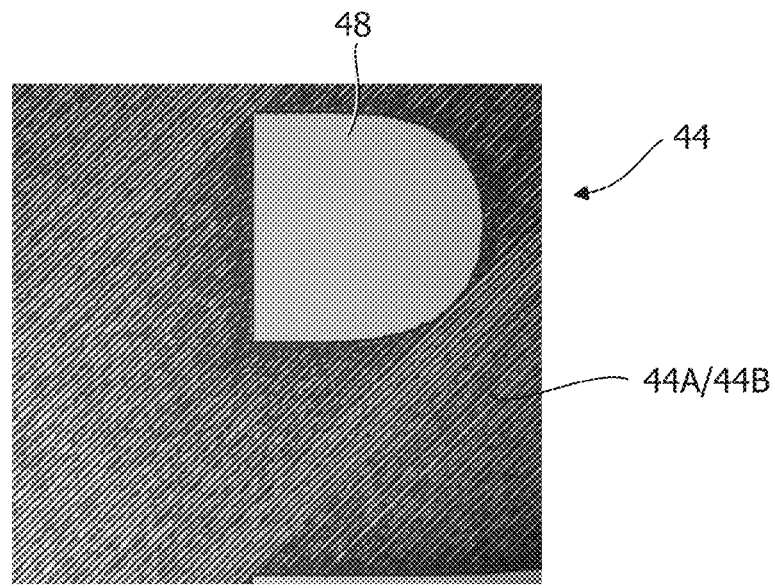
FIGS. 3A to 3C shows an illustration of different patterns generated on a light-reflective layer of the light guide according to the invention, The figures are purely diagrammatic and not drawn to scale. Particularly for clarity, some dimensions are exaggerated strongly. Similar components in the figures are denoted by the same reference numerals as much as possible.

The embodiment of the light guide 10 as shown in FIG. 1A comprises a pattern 42 which has a relatively low density of deformations 42A near the light source 60 and which has a relatively high density of deformations 42B further away from the light source 60. As the intensity of the light near the light source 60 typically is relatively high, this pattern 42 of deformations 42A, 42B, 44A, 44B generates a substantially uniform distribution of the light emitted by the light-emitting window 20. In the embodiment of the light guide 12 as shown in FIG. 1B, the pattern 44 comprises localised deformations 44A, 44B which may constitute an image 44. In such an image 44, grey levels are present by different densities of deformations 44A, 44B in which high density 44B represents dark grey levels and low density 44A represent light grey levels. Alternatively, the different grey-levels may be generated by altering a height h of the deformations 42A, 42B, 44A, 44B generated in the light/reflective layer 40. The image 44 or pattern 44 shown in cross-section of FIG. 1B may be part of an image 44 or letters 44 as shown in FIG. 3A in which a part of the letter "P" is shown from the name "Philips" which is generated as deformations 44A, 44B in the light-reflective layer 40 of the light guide 10, 12.

The refractive index $n_2$ of the deformable substantially transparent layer 30 is preferably higher compared to the refractive index $n_1$ of the light guide 10, 12 because this difference in refractive index extracts light from the light guide 10, 12 towards the light-reflective layer 40. When the light-reflective layer 40 is deformed at the location where the light impinges on the light-reflective layer 40, the impinging light is scattered 70 in different directions, thus enabling much of the light to be coupled out from the light guide 10, 12. The light-emitting window 20 typically is exposed to air to confine light inside the light guide 10, 12 via total internal reflection at the light-emitting window 20, especially when the light of the light source 60 is emitted substantially parallel to the light-emitting window 20.

The deformations 42A, 42B, 44A, 44B may be generated using a laser beam 50 having a central wavelength of the emitted light between 320 nanometers and 2000 nanometers. The laser beam 50 may impinge on the rear wall of the light-reflective layer 40 as indicated with a thick arrow having reference number 50. Alternatively, the laser beam 50 may impinge on the light reflective layer 40 via the light guide 10, 12 and the deformable substantially transparent layer 30 to generate the deformations 42A, 42B, 44A, 44B in the light-reflective layer 40 (indicated with a dash-dotted arrow having reference number 50). Even further alternatively, the deformable substantially transparent layer 30 is deformed by the impinging laser beam 50.

Figure 2A:
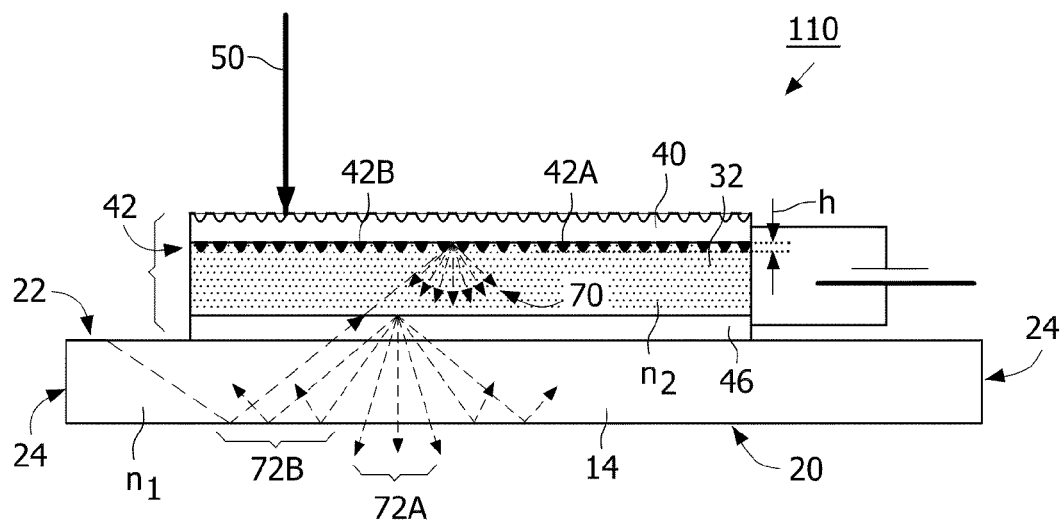
FIGS. 2A and 2B shows a schematic cross-sectional view of a patterned light emitting diode device according to the invention.
Figure 2B:
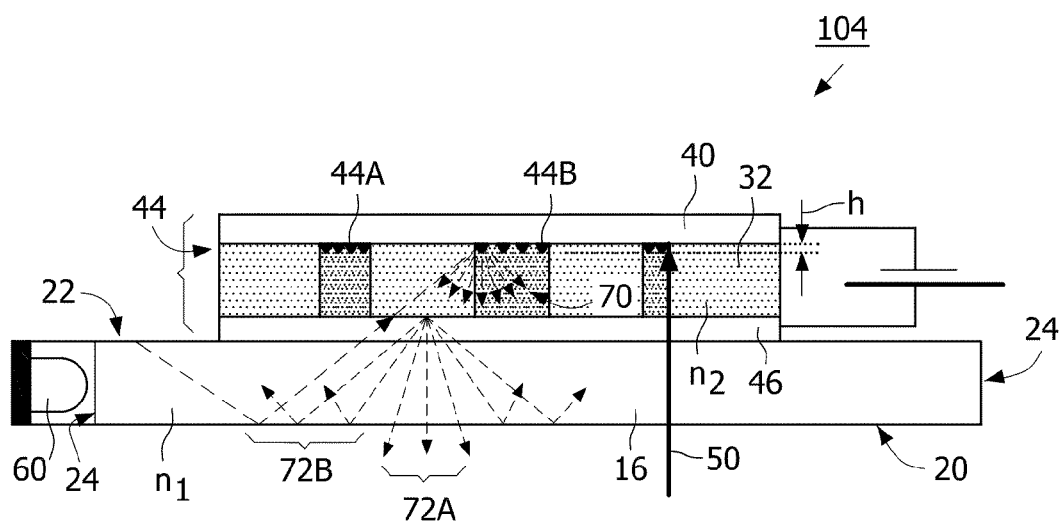

In the embodiment of the light emitting diode device 110, 104 as shown in FIGS. 2A and 2B, the light-reflective layer 40 is the cathode layer 40. The light emitting diode device 110, 104 further comprises a light emitting layer 32 being the deformable substantially transparent layer 30, and further comprises an anode layer 46. In such an arrangement, the anode layer 46 is typically constituted of a transparent metal layer, for example, constituted of ITO. Of course the cathode layer 40 and anode layer 46 may be exchanged such that the pattern 42, 44 of deformations 42A, 42B, 44A, 44B is generated in the anode 46 and the cathode layer 40 is substantially transparent. Also in the embodiments shown in FIGS. 2A and 2B the pattern 42, 44 of deformations 42A, 42B, 44A, 44B may constitute a pattern 42 constituted of a distribution of deformations 42A, 42B enhancing the extraction of light generated by the light emitting diode device 110, 104 away from the light emitting diode device 110, 104. The distribution of deformations 42A, 42B preferably would be substantially uniform across the light-reflective layer 40—as shown in FIG. 2A—and thus improve the efficiency of the light emitting diode device 110, 104 as less of the light generated by the light emitting diode device 110, 104 is captured in the substrate 14, 16 constituting the light guide 14, 16. The generation of light from the light emitting layer 36 is indicated with dashed arrows. Part of this generated light (indicated with 72A) is transmitted through the substrate 14, 16. A further part of the generated light (indicated with 72B) is trapped inside the substrate 14, 16 acting as a waveguide 14, 16 and confined due to total internal reflection from the light emitting window 20. This captured light 72B scatters through the light emitting diode device 110, 104 and also through the anode layer 46 and the light emitting layer 32 and reflecting from the cathode layer 40. Due to the presence of the deformations 42A, 42B, 44A, 44B part of the reflected light from the cathode layer 40 is scattered 70 and is extracted from the light emitting diode device 110, 104. Alternatively, the pattern 44 of deformations 44A, 44B constitutes an image 44 or text 44 visible both during the off-state of the light emitting diode device 110, 104 and during the on-state of the light emitting diode device 110, 104.

The deformations 42A, 42B, 44A, 44B are preferably generated in the cathode layer 40 while substantially maintaining the conductivity of the cathode layer 40. This has the major benefit that pattern 42, 44 in which, for example, a non-patterned part must be present surrounded by a patterned part, the conductivity of the cathode layer 40 at the surrounded non-patterned part is still sufficient to allow the light emitting diode device 110, 104 to still emit light at the non-patterned part surrounded by patterned area. Patterning of light emitting diode devices to generate images or readable text is known in the art. In some known methods of patterning, one of the electrode layers is cut through due to the patterning, blocking the current flowing to isolated non-patterned areas causing the known light emitting diode device to not emit light at this isolated non-patterned area. For example, patterning the letter "O" by cutting through the electrode layer would cause the center of the letter "O" not to emit light due to this cutting through the electrode, while the center of the letter "O" would still emit light when the pattern 44 would be created using the deformations 42A, 42B, 44A, 44B according to the invention in which the conductivity of the cathode layer 40 is substantially maintained.

So, preferably the deformations 42A, 42B, 44A, 44B in the light-reflective layer 40 being the cathode-layer 40 is done without damaging any of the layers 40, 32, 46 of the light emitting diode device 110, 104 which are used for the light emission. As the deformations 42A, 42B, 44A, 44B are generated in the light-reflective layer 40 such that substantially the conductivity of the light-reflective layer 40 is maintained, the whole light emitting layer 32 of the light emitting diode device 110, 104 will radiate light while the pattern 42, 44 is used to extract light from the light guide 14, 16 or from the substrate 14, 16.

Substantially maintaining the conductivity of the light-reflective layer 40 indicates that the overall conductivity across the light-reflective layer 40 is maintained while, for example, minute holes and/or cracks (not shown) may appear. Although, as indicated before, in a preferred embodiment of the patterned light emitting diode device 110, 104, no holes and/or cracks are present in the light-reflective layer 40 as they would typically reduce the reflectivity of the light-reflective layer 40 at the location of the holes and/or cracks, the patterned light emitting diode device 110, 104 still operates with these minute holes and/or cracks present. The quality of the pattern 42, 44 may be reduced due to these minute holes and/or cracks reducing the scattering property of the pattern 42, 44. Minute holes and/or cracks preferably have dimensions which are not visible by the naked human eye and/or may have dimensions, for example, smaller than 100 μm, and more preferably smaller than 10 μm.

Again, the pattern 44 may comprise a plurality of grey-levels 44A, 44B generated by different densities of the deformations 44A, 44B. Alternatively, the different grey-levels may be generated by altering a height h of the deformations 44A, 44B.

In the embodiment of the light emitting diode device 110 as shown in FIG. 2A, the deformations 42A, 42B, are generated via a laser beam 50 impinging on a rear surface of the light-reflective layer 40. Alternatively, as shown in FIG. 2B, the laser beam 50 transmits through the light guide 16 and the anode layer 46 via the light emitting layer 32 and impinges on the reflective part of the light-reflective layer 40. In such an embodiment, the light emitting layer 32 may be damaged due to the relatively high light intensity of the laser beam 50 which is indicated with darker regions in the light emitting layer 32. Typically these regions do not emit light anymore or at a much reduced intensity. As such, the number of deformations, 44A, 44B is preferably relatively small compared to the area in which light is generated. If, for example, ten percent of the surface of the light-reflective layer 40 comprises deformations, 44A, 44B generated via irradiation via the light emitting layer 32, approximately ten percent of the light emitting layer 32 does not emit light anymore or at a much reduced intensity. Still, due to the presence of the deformations, 44A, 44B the efficiency of the extracted light increased, for example, more than thirty percent, which still enables to increase the efficiency of the light emitted by the light emitting diode device 110, 104.

Both FIGS. 2A and 2B shown illumination systems 110, 104 in which in the embodiment shown in FIG. 2B the illumination system 104 comprises a light source 60 arranged at an edge wall 24 of the light guide 16. This light source 60 may emit light having a different color compared to the light emitted by the light emitting layer 32 and as such would contribute to the emission of the illumination system 104. When the light emitting diode device 104 is an organic light emitting diode device 104, the emission of different colors is relatively difficult and requires different layers (not shown) of light emitting material 32 to be present, each having their own anode layer 46 and/or cathode layer 40. By applying the light source 60 to emit light into the light guide 16 via an edge-wall 24 of the light guide 16, the light source 60 may emit light of a different color compared to the light emitting layer 32 which may be used to adapt and/or mix and/or alter the color of the light emitted from the illumination system 104.

Figure 3B:
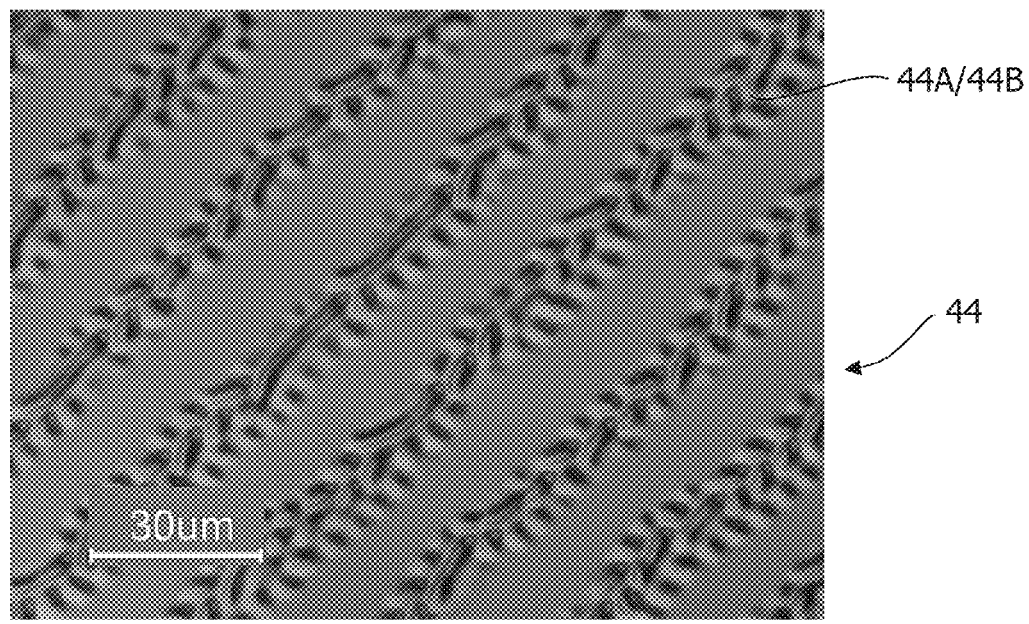
Figure 3C:
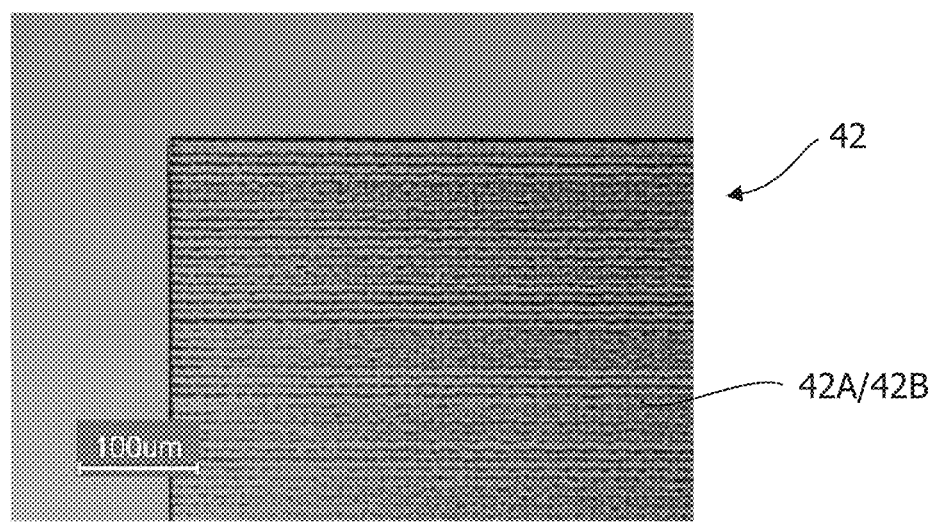

FIGS. 3A to 3C shows an illustration of different patterns 42, 44 generated on a light-reflective layer 40 of a light guide 10, 12, 14, 16 or an organic light emitting diode device 104, 110 according to the invention. In FIG. 3A a detailed part of a letter "P" is shown. The deformations 44A, 44B are generated in lines arranged diagonally. The lines of deformations constituting the pattern 44 of FIG. 3A are shown in more detail in FIG. 3B. Choosing a right power of the condensed light beam 50 would generate deformations 44A, 44B without generating holes and/or cracks as is illustrated in FIG. 3B. Such deformations in the pattern 44 as shown in FIG. 3A would cause the letter "P" to be clearly visible both during the on-state and during the off-state of the light emitting diode device 110, 104 while also the center-part 48 of the letter "P" being the unpatterned part 48 will illuminate light during the on-state.

FIG. 3C shows a part of a different pattern 42 in which the pattern 42 is constituted of uniformly distributed lines of deformations 42A, 42B. In FIG. 3C the uniform distribution of the lines causes the extracted light to substantially uniformly illuminate the light-emitting window 20 generating a uniform emission of light across the light-emitting window 20. This pattern shown in FIG. 3C may be applied on a light emitting diode device 110, 104 as shown in FIGS. 2A and 2B.

Alternatively the pattern shown in FIG. 3C may comprise a gradient in which the density of the lines of deformations 42A, 42B increases as the distance to the light source 60 increases as shown in FIG. 1A.

It should be noted that the above-mentioned embodiments illustrate rather than limit the invention, and that those skilled in the art will be able to design many alternative embodiments without departing from the scope of the appended claims.

In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. A light guide comprising a light-emitting window, a rear wall situated opposite said light-emitting window, edge walls extending between the light-emitting window and the rear wall, the light guide further comprising a deformable substantially transparent layer arranged between a light-reflective layer and the rear wall of the light guide, the light-reflective layer comprising a pattern constituted of local deformations of the light-reflective layer for scattering impinging light, wherein the light-reflective layer and/or the deformable substantially transparent layer is configured for being locally deformed when irradiated with electro-magnetic radiation having a power below an ablation threshold of any of the layers of the light guide.

2. Light guide as claimed in claim 1, wherein the pattern is configured for generating a predefined distribution of light emitted across the light-emitting window.

3. Light guide as claimed in claim 1, wherein the refractive index of the deformable substantially transparent layer is equal to or higher compared to the refractive index of the light guide.

4. Light guide as claimed in claim 1, wherein the pattern comprises a plurality of grey-levels, the different grey-levels comprising a different density of the deformations of the light-reflective layer, and/or comprising a different height of the deformations of the light-reflective layer, the height being a dimension substantially perpendicular to the light-reflective layer.

5. Light guide as claimed in claim 3, wherein a wavelength of the electro-magnetic radiation for generating the deformations is in a range between 320 nanometers and 2000 nanometers.

6. Patterned light emitting diode device comprising the light guide according to claim 1, wherein the patterned light emitting diode device comprises a layer of light emitting material and comprising the light-reflective layer being visible through a light-emitting window of the light guide of the patterned light emitting diode device, the light-reflective layer comprising a pattern constituted of local deformations of the light-reflective layer.

7. Patterned light emitting diode device as claimed in claim 6, wherein the deformable substantially transparent layer comprises light emitting material of the light emitting diode device arranged between an anode layer and a cathode layer, the anode layer or cathode layer being the light-reflective layer comprising the pattern constituted of deformations while substantially maintaining a conductivity of the light-reflective layer parallel to the light-reflective layer.

8. Patterned light emitting diode device as claimed in claim 6, wherein the patterned light emitting diode device comprises the anode layer and the cathode layer, and wherein at least a part of the anode layer or the cathode layer is configured to be substantially transparent to the electro-magnetic radiation.

9. Patterned light emitting diode device as claimed in claim 1, wherein the deformations have been generated while substantially preventing damaging a contact between subsequent layers of the patterned light emitting diode device.

10. Patterned light emitting diode device as claimed in claim 6, wherein the area of the patterned light emitting diode device comprising the deformations is equal or smaller compared to the area of the patterned light emitting diode device being free from deformations.

11. Illumination system comprising a light guide according to claim 1 and a light source, or comprising a patterned light emitting diode device and the light source.

12. Illumination system as claimed in claim 11, wherein the light source is configured for emitting light into the light guide in a direction substantially parallel to the light-emitting window for at least partially confining the light emitted by the light source in the light guide via total internal reflection at the light-emitting window.

13. Method of generating local deformations in a light guide according to claim 1 or for generating local deformations in a patterned light emitting diode device, the method of generating comprises the step of locally deforming the light-reflective layer and/or the deformable substantially transparent layer for generating the deformations constituting the pattern.

14. Method of generating local deformations as claimed in claim 13, wherein the step of locally deforming comprises:
illuminating part of the light-reflective layer and/or the deformable substantially transparent layer with electro-magnetic radiation for generating the pattern, the electro-magnetic radiation locally altering a temperature of the light-reflective layer and/or the deformable substantially transparent layer for deforming the light-reflective layer and/or the deformable substantially transparent layer while having a power below an ablation threshold of any of the layers of the light guide.

15. Method of generating as claimed in claim 13, wherein the method further comprises the steps of:
measuring an emission characteristic of the light guide,
determining from the measured emission characteristic a pattern of deformations for generating a predefined light distribution across the light-emitting window, and
generating the deformations according to the determined pattern for generating the predefined light distribution.

16. A light guide comprising a light-emitting window, a rear wall situated opposite said light-emitting window, edge walls extending between the light-emitting window and the rear wall, the light guide further comprising a deformable substantially transparent layer arranged between a light-reflective layer and the rear wall of the light guide, the light-reflective layer comprising a pattern constituted of local deformations of the light-reflective layer for scattering impinging light, wherein the pattern comprises a plurality of grey-levels, the different grey-levels comprising a different density of the deformations of the light-reflective layer, and/or comprising a different height of the deformations of the light-reflective layer, the height being a dimension substantially perpendicular to the light-reflective layer.

* * * * *